(12) United States Patent
Liu et al.

(10) Patent No.: US 8,647,962 B2
(45) Date of Patent: Feb. 11, 2014

(54) WAFER LEVEL PACKAGING BOND

(75) Inventors: Martin Liu, Yonghe (TW); Richard Chu, Taipei (TW); Hung Hua Lin, Taipei (TW); Hsin-Ting Huang, Bade (TW); Jung-Huei Peng, Jhubei (TW); Yuan-Chih Hsieh, Hsin-Chu (TW); Lan-Lin Chao, Sindian (TW); Chun-Wen Cheng, Zhubei (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 220 days.

(21) Appl. No.: 12/729,911

(22) Filed: Mar. 23, 2010

(65) Prior Publication Data
US 2011/0233621 A1    Sep. 29, 2011

(51) Int. Cl.
*H01L 21/30* (2006.01)
*H01L 21/00* (2006.01)
*H01L 21/46* (2006.01)
*H01L 21/76* (2006.01)

(52) U.S. Cl.
USPC ............. 438/455; 438/406; 438/51; 438/456

(58) Field of Classification Search
USPC ........... 438/455, 696, 406, 51, 118, 119, 459
See application file for complete search history.

(56) References Cited

U.S. PATENT DOCUMENTS

| | | | |
|---|---|---|---|
| 6,841,453 B2 * | 1/2005 | Mastromatteo | 438/455 |
| 7,442,570 B2 | 10/2008 | Nasiri et al. | |
| 7,839,001 B2 * | 11/2010 | Boussagol et al. | 257/782 |
| 2010/0148341 A1 * | 6/2010 | Fuji et al. | 257/686 |
| 2010/0283138 A1 * | 11/2010 | Chen et al. | 257/678 |

* cited by examiner

*Primary Examiner* — Chuong A. Luu
(74) *Attorney, Agent, or Firm* — Haynes and Boone, LLP

(57) ABSTRACT

The present disclosure provides a method of bonding a plurality of substrates. In an embodiment, a first substrate includes a first bonding layer. The second substrate includes a second bonding layer. The first bonding layer includes silicon; the second bonding layer includes aluminum. The first substrate and the second substrate are bonded forming a bond region having an interface between the first bonding layer and the second bonding layer. A device having a bonding region between substrates is also provided. The bonding region includes an interface between a layer including silicon and a layer including aluminum.

13 Claims, 4 Drawing Sheets

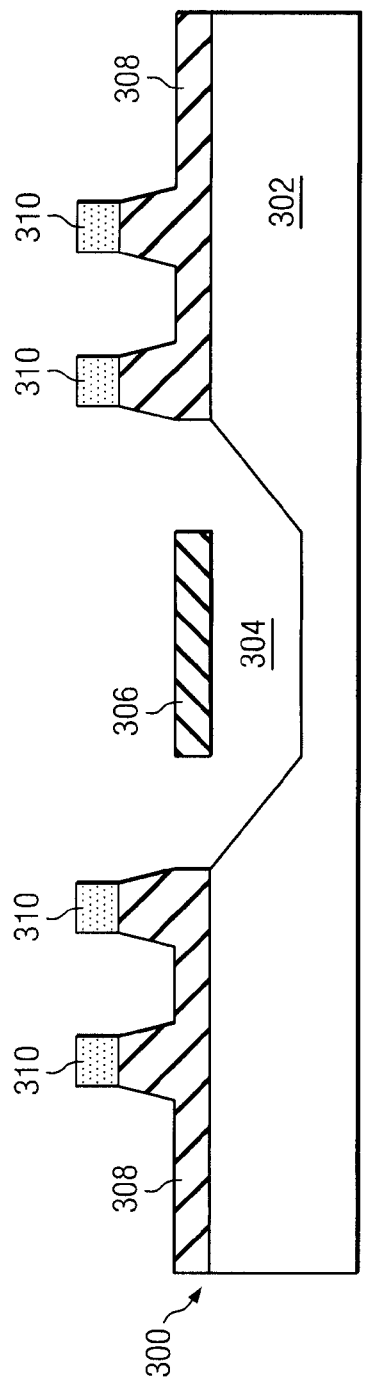
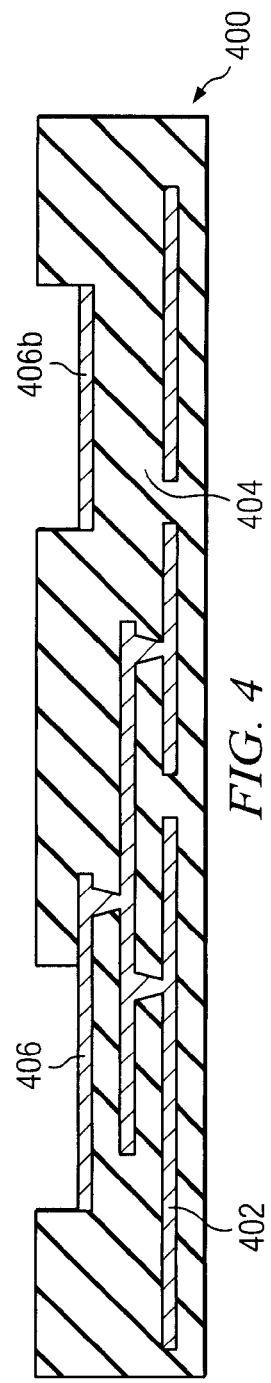
FIG. 3
FIG. 4

US 8,647,962 B2

WAFER LEVEL PACKAGING BOND

BACKGROUND

Wafer level packaging (WLP) technology provides for the packaging of semiconductor devices at a wafer level. WLP is employed in a variety of technologies including 3D-integrated circuits (IC), chip scale package (CSP) devices, and micro-electro-mechanical systems (MEMS). Potential advantages of using WLP technology include enhancing electrical properties, providing for increased density, reducing device sizes, reducing costs, and allowing for additional testing at wafer level. However, there are several limitations to the current WLP technology and the integration of the wafer fabrication and packaging processes it provides. The methods of packaging (e.g., protecting the device and providing interconnections to the outside world) may not be compatible with the fabrication processes that are used to form the devices. For example, indium-gold, gold-gold, and solder-gold eutectic bonding have been used to assemble MEMS devices. While these bonds may provide hermetic sealing and/or electrical interfaces, the materials are not compatible with some fabrication processes (e.g., complementary metal-oxide semiconductor (CMOS)).

SUMMARY

The present disclosure provides a method. The method includes providing a first substrate including a first bonding layer and providing a second substrate including a second bonding layer. The first bonding layer includes silicon. The second bonding layer includes aluminum. The first substrate and the second substrate are bonded. The bonding includes forming a bond region having an interface between the first bonding layer and the second bonding layer.

In another embodiment, the present disclosure provides a method including forming a first semiconductor device on a first substrate and forming a second semiconductor device on a second substrate. The method also includes forming a first layer, including silicon, on the first substrate. A second layer is formed on the second substrate. The second layer includes aluminum. The first layer and the second layer are bonded providing an electrical connection between the first substrate and the second substrate.

According to various embodiments, the present disclosure also provides a device. In an embodiment, the device includes a MEMS device, disposed on a first substrate, and another semiconductor device disposed on a second substrate. The device further includes a bond electrically connecting the MEMS device and the semiconductor device. The bond includes an interface between a first bonding layer including silicon and a second bonding layer including aluminum.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3 is a cross-sectional view of an embodiment of a substrate including a MEMS device.

FIG. 4 is a cross-sectional view of an embodiment of a substrate including a CMOS device.

DETAILED DESCRIPTION

Figure 1:
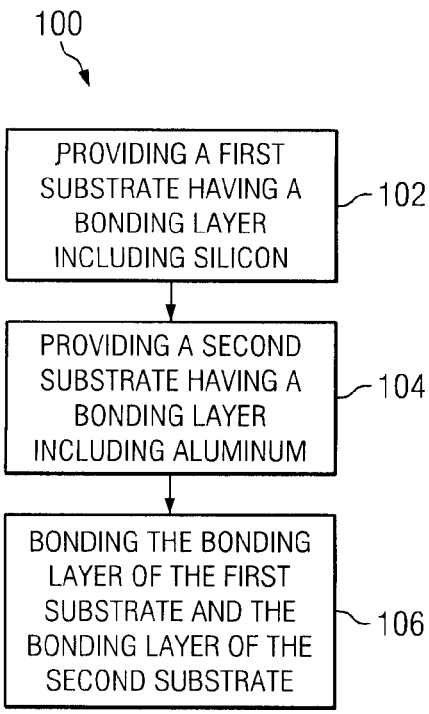
FIG. 1 is a flowchart of an embodiment of a method of bonding substrates.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

It is further understood that the present disclosure refers generally to WLP to refer to the packaging of a substrate. The substrates described herein may take various forms including but not limited to wafers (or portions thereof) having integrated circuits including those formed by CMOS-based processes, die, MEMS substrates, capping substrates, a single substrate with CMOS devices and MEMS devices formed thereon, and the like. Furthermore, as described above, specific embodiments may be described herein which are exemplary only and not intended to be limiting. For example, embodiments that refer to a substrate being a MEMS substrate, a CMOS substrate, or the like are exemplary only and not intended to limit the disclosure to any particular technology.

FIG. 1 is a flowchart illustrating an embodiment of a method of bonding substrates. The method 100 begins at block 102 wherein a first substrate is provided. The substrate provided includes a semiconductor device such as an IC including a metal-insulator-semiconductor field effect transistor (MOSFET) including complementary MOSFET (CMOS), a CMOS imaging sensor (CIS), a MEMS, and/or other suitable active and/or passive devices. In an embodiment, the substrate includes an integrated circuit (or portion thereof) designed and formed by a CMOS-based processes. This may be referred to herein as a CMOS substrate. A substrate including a MEMS device may be referred to herein as a MEMS substrate. A substrate including a device formed using other semiconductor fabrication technologies is also within the scope of the described method. In one example, the substrate is a silicon wafer. The substrate may alternatively or additionally include other elementary semiconductor, such as germanium. The substrate may also include a compound semiconductor, such as silicon carbide, gallium arsenic, indium arsenide, and indium phosphide. The substrate typically includes a plurality of features formed thereon providing a semiconductor device or portion thereof.

The first substrate includes a bonding layer. In an embodiment, the bonding layer includes silicon. Examples of the bonding layer compositions include amorphous silicon, polysilicon, a combination of amorphous silicon and polysilicon, silicon doped with one or more impurities, and other suitable substantially silicon-based compositions. The bonding layer may be formed by physical vapor deposition (PVD), chemical vapor deposition (CVD), evaporation, electron beam evaporation (E-gun), ion beam, energy beam, combinations thereof, and/or other suitable deposition processes. Other manufacturing techniques used to form the bonding layer may include photolithography processing and/or etching to pattern the bonding layer. In an embodiment, a bonding layer is formed and subsequently or concurrently doped with impurities. The doping may be performed in order to enhance the electrical performance of the associated device (e.g., decrease the bias). Example impurities include boron, phosphorus, arsenic, and/or other suitable dopants known in the art. In one embodiment, a substantially-silicon based bonding layer is approximately 3.5 kA in thickness.

The method 100 continues to block 104 wherein a second substrate is provided. The second substrate provided includes a semiconductor device or portion thereof. The second substrate may be any substrate including a device designed to interface with the first substrate. Example semiconductor devices include integrated circuits including a metal-insulator-semiconductor field effect transistor (MOSFET) including complementary MOSFET (CMOS) features, CIS, MEMS, and/or other suitable active and/or passive devices. In an embodiment, the second substrate includes an integrated circuit (or portion thereof) designed and formed using a CMOS-based process. A substrate including a semiconductor device formed using CMOS technology may be referred to herein as a CMOS substrate. A MEMS substrate may be a silicon wafer including MEMS features and/or functionalities. A substrate having a device (e.g., integrated circuit) formed by other semiconductor fabrication technologies is also within the scope of the described method. In one example, the second substrate is a silicon wafer. The substrate may alternatively or additionally include other elementary semiconductor, such as germanium. The second substrate may also include a compound semiconductor, such as silicon carbide, gallium arsenic, indium arsenide, and indium phosphide. The second substrate typically includes a plurality of features formed thereon providing a semiconductor device or portion thereof.

The second substrate also includes a bonding layer. In an embodiment, the bonding layer includes aluminum. Example compositions of the bonding layer include an aluminum layer having a ratio of 0.5:99.5 Cu to Al, an aluminum layer having a ratio of 97.5:2:0.5 Al to Si to Cu, and/or other suitable substantially aluminum-based compositions. The substantially aluminum-based bonding layer may be formed by CVD, physical vapor deposition (sputtering), plating, and/or other suitable processes. Other manufacturing techniques to form the bonding layer may include photolithography processing and/or etching to pattern the bonding layer. In an embodiment, the bonding layer, or portion thereof, is part of a multilayer interconnect (MLI) structure of a semiconductor device. The MLI includes horizontal conductive features (metal lines) disposed at multiple metal layers and vertical conductive features, such as contacts and vias. A via is configured to connect two metal lines at different metal layers. A contact is configured to connect a metal line and the substrate. In one embodiment, the bonding layer is approximately 8 kA in thickness.

The method 100 then proceeds to block 106 where a bonding process is performed. In particular, the bonding layer of the first substrate, provided in block 102, and the bonding layer of the second substrate, provided in block 104, are bonded. Thus, a bonding layer including silicon is bonded to a bonding layer including aluminum. In doing so, the first and second substrate are physically bonded (e.g., coupled). The bonding may be provided by a solid-phase reaction. In an embodiment, the bonding provides an electrical interface between the first and second substrate (or devices formed thereon) at one or more bonding regions (e.g., region of physical interface between substrates). In an embodiment, at a bonding region one or more of the bonding layers is formed on a non-conducting layer (e.g., insulating layer) and no electrical interface is provided at that region.

The bonding process may be performed in the presence of a forming gas and/or another controllable environment. Example forming gases include argon, nitrogen ($N_2$), hydrogen ($H_2$), nitrogen/hydrogen mixture, and/or other suitable gases. The forming gases may serve to de-oxidize the bonding layer(s). In one embodiment, the process temperature of the bonding process is greater than approximately 50 degrees Celsius (C). In one embodiment, the process time is greater than approximately 10 seconds.

In an embodiment, a surface clean is performed prior to the bonding process. The surface clean may include a wet etch, a dry etch, or combinations thereof. The surface clean is described in greater detail with reference to FIG. 2 at block 210. In an embodiment, a post-bonding thermal process is performed (e.g., anneal). An exemplary process is described in greater detail with reference to FIG. 2 at block 214.

The method 100 may be used to implement a variety of embodiments. For example, in one embodiment a substantially silicon-based bonding layer is provided on a MEMS substrate and a substantially aluminum-based bonding layer is provided on a CMOS substrate. These substrates, and the bonding layers, are bonded together using the described method. In another embodiment, a substantially silicon-based bonding layer is disposed on a CMOS substrate and a substantially aluminum-based bonding layer is disposed on a MEMS substrate. These substrates, and the corresponding bonding layers, are bonded together using the described method. In yet further embodiments, the methods described herein may be applied to bonding of a plurality of MEMS substrates, a plurality of CMOS substrates, and/or any combination thereof. (It should be noted that while described herein as applied to the bonding of two substrates, the methods and devices described are scalable to bonding any number of substrates.)

Figure 2:
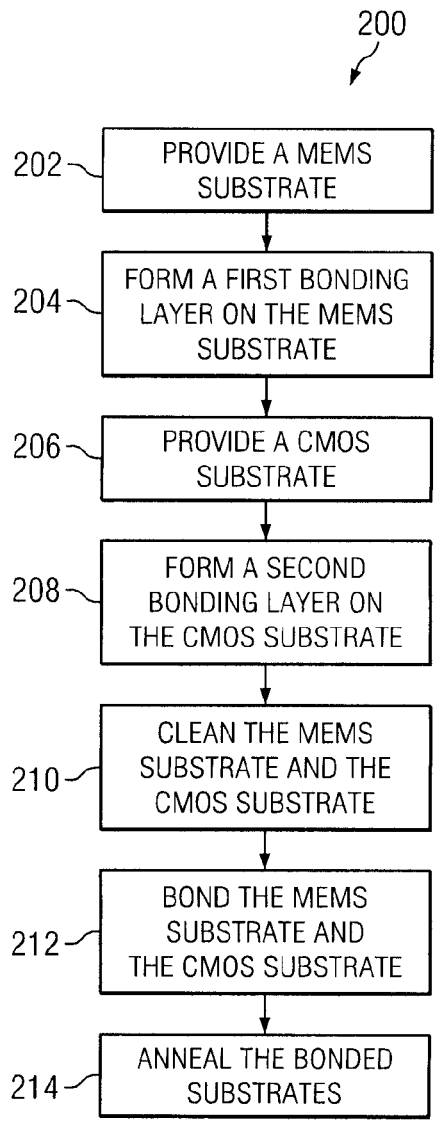
FIG. 2 is a flowchart of an embodiment of the method of FIG. 1.
Figure 5:
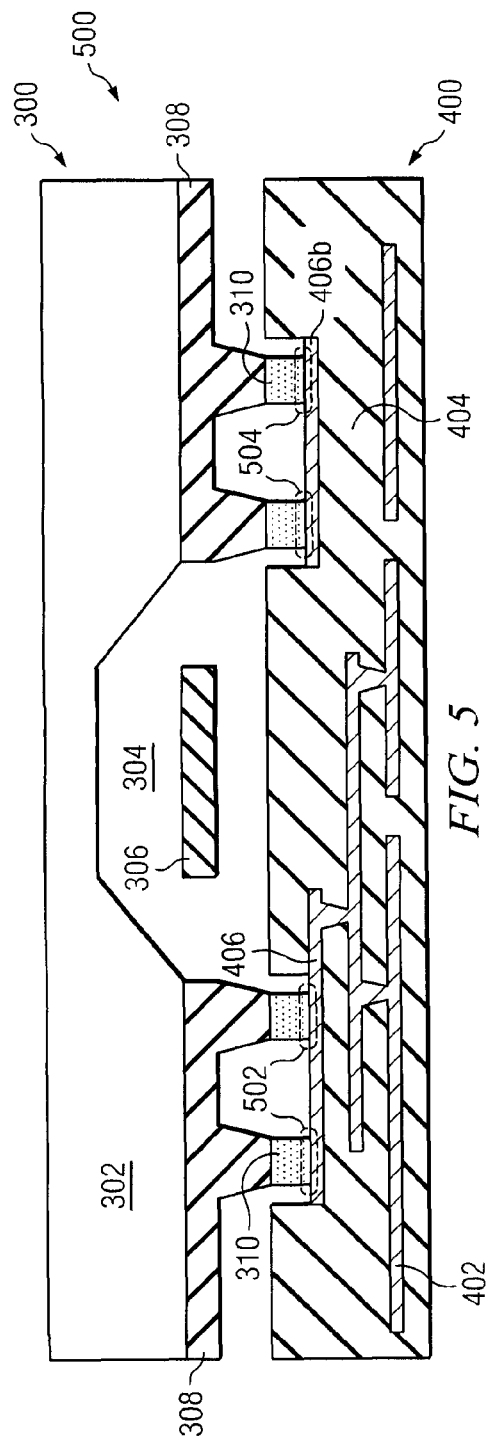
FIG. 5 is a cross-sectional view of an embodiment of a device including the substrate of FIG. 3 bonded to the substrate of FIG. 4.

Referring now to FIG. 2, illustrated is the method 200 which provides for the bonding of a plurality of substrates. As described above, the method 200 is but one embodiment of the method 100, described above with reference to FIG. 1, and not intended to be limiting in any manner. FIGS. 3, 4, and 5 are cross-sectional views of one or more devices constructed according to aspects of the present disclosure.

The method 200 begins at block 202 where a MEMS substrate is provided. The MEMS substrate may be substantially similar to the first and/or second substrate described above with reference to FIG. 1. The MEMS substrate may be a wafer or combination of wafers (including portions thereof) including MEMS features and functionality. In an embodiment, the wafer is a silicon wafer. Referring to the example of FIG. 3, a MEMS substrate 300 is provided. The MEMS substrate 300 includes a substrate 302, a MEMS cavity 304, a proof mass 306, and a stand-off feature 308. Numerous other features and configurations are possible. In an embodiment, the substrate 302 is a silicon substrate. The stand-off feature 308 may be configured to provide the appropriate separation between the MEMS substrate 300 and substrate to which it is to be bonded to, described below with reference to block 206. The proof mass 306 may provide a reference mass that is used to measure the variable to which the MEMS is directed.

The method 200 then proceeds to block 204 where a first bonding layer is formed. In an embodiment, the first bonding layer, or portion thereof, is included in the MEMS device. In an alternative embodiment, the first bonding layer is formed on the MEMS substrate after completing the fabrication of the MEMS device. In an embodiment, the first bonding layer may be a substantially silicon-based layer. The substantially silicon-based layer may be substantially similar to as described above with reference to block 102 of the method 100, described above with reference to FIG. 1. For example, the substantially silicon-based layer may include amorphous silicon and/or polysilicon. In an alternative embodiment, the first bonding layer may be a substantially aluminum-based layer. The substantially Al-based layer may be substantially similar to as described above with reference to block 104 of the method 100, also described above with reference to FIG. 1. Referring to the example of FIG. 3, a bonding layer 310 is disposed on the MEMS substrate 300. In an embodiment, the bonding layer 310 is amorphous silicon. Other example compositions include polysilicon. In an embodiment, the bonding layer 310 is doped with one or more impurities. As illustrated by FIG. 3, the bonding layer 310 is a patterned layer. The pattern is designed to interface, physically and/or electrically, with the CMOS substrate at a plurality of bonding regions. In an embodiment, the bonding layer is an amorphous silicon layer which is pre-treated (e.g., prior to bonding) with a thermal process (e.g., anneal process). The thermal process may convert the layer or portion thereof to a polysilicon layer.

The method 200 then proceeds to block 206 where a CMOS substrate is provided. The CMOS substrate may be substantially similar to the first and/or second substrate described above with reference to FIG. 1. The CMOS substrate may be any substrate (e.g., wafer) with one or more semiconductor devices implemented (e.g., designed and fabricated) by a CMOS-based technology formed thereon. Referring to the example of FIG. 4, the CMOS substrate 400 is provided. The CMOS substrate 400 includes a MLI 402 and insulating layer 404 (e.g., interlayer dielectric (ILD)).

The method 200 then proceeds to block 208 where a second bonding layer is formed on the CMOS substrate. In an embodiment, the second bonding layer is formed as part of a semiconductor device disposed on the CMOS substrate (e.g., is part of an MLI). In an embodiment, the second bonding layer may be a substantially aluminum-based layer, substantially similar to as described above with reference to block 104 of the method 100, described above with reference to FIG. 1. In an alternative embodiment, the first bonding layer may be a substantially silicon-based layer, substantially similar to as described above with reference to block 102 of the method 100, also described above with reference to FIG. 1. Referring to the example of FIG. 4, a bonding layer 406 is illustrated. In an embodiment, the bonding layer 406 includes aluminum. As illustrated by FIG. 4, the bonding layer 406 is a patterned layer. The pattern is designed to interface with the MEMS substrate (e.g., electrically and physically) at a plurality of bonding regions. FIG. 4 also illustrates the bonding layer 406 includes a portion 406b that is disposed on an insulating layer 404. The insulating layer 404 may include a dielectric material such as silicon oxide, silicon nitride, silicon oxynitride, spin-on glass (SOG), low k material, fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The insulating layer 404 is formed by a methods such as spin-on coating, CVD, and/or other suitable processes.

The method 200 then proceeds to block 210 where the MEMS substrate and/or the CMOS substrate are cleaned. In an embodiment, block 210 is omitted. The cleaning process may include a wet etch/clean and/or dry etch processes. Example wet etch/clean processes include exposure to hydrofluoric acid (HF) including dilute HF. Example dry etch processes include argon sputtering and plasma etch processes. The cleaning process may include other suitable processes such as de-ionized water rinses and drying processes (e.g., spin dry). The clean may serve to de-oxidize the bonding layer(s).

The method 200 then proceeds to block 212 where the MEMS substrate and the CMOS substrate are bonded. In particular, the bonding layer of the MEMS substrate is bonded to the bonding layer of the CMOS substrate. The bonding creates bonding regions which provide physical coupling of the substrates. In an embodiment, one or more bonding regions also provide an electrical interface between the CMOS and MEMS substrates or the devices formed thereon.

The bonding may be performed by a commercially available wafer bonder. In an embodiment, the process temperature for the bonding is greater than approximately 50 C. In an embodiment, the process time is greater than approximately 10 seconds. These process parameters are exemplary only. The bonding may be performed in a controlled atmosphere (e.g., in the presence of a forming gas). Example forming gases include Ar, N2, $H_2$, He, $N_2/H_2$, and combinations thereof. An alignment process is typically performed prior to the bonding.

Referring to the example of FIG. 5, illustrated is a device 500 which includes the CMOS substrate 400 and the MEMS substrate 300. The bonding layer 310 and the bonding layer 406 are bonded such that an interface between the two layers is provided (e.g. bonding region). The bonding region denoted 502 illustrates an electrical interface in addition to the mechanical coupling. The bonding region 504 illustrates a mechanical coupling; the bonding layer 406b is disposed on the insulating material 404 of the CMOS substrate 400.

The method 200 then proceeds to block 214 where the bonded substrates are annealed. In an embodiment, block 214 is omitted. Example process conditions for the anneal process include a temperature between approximately 400 C and approximately 500 C.

Figure 6:
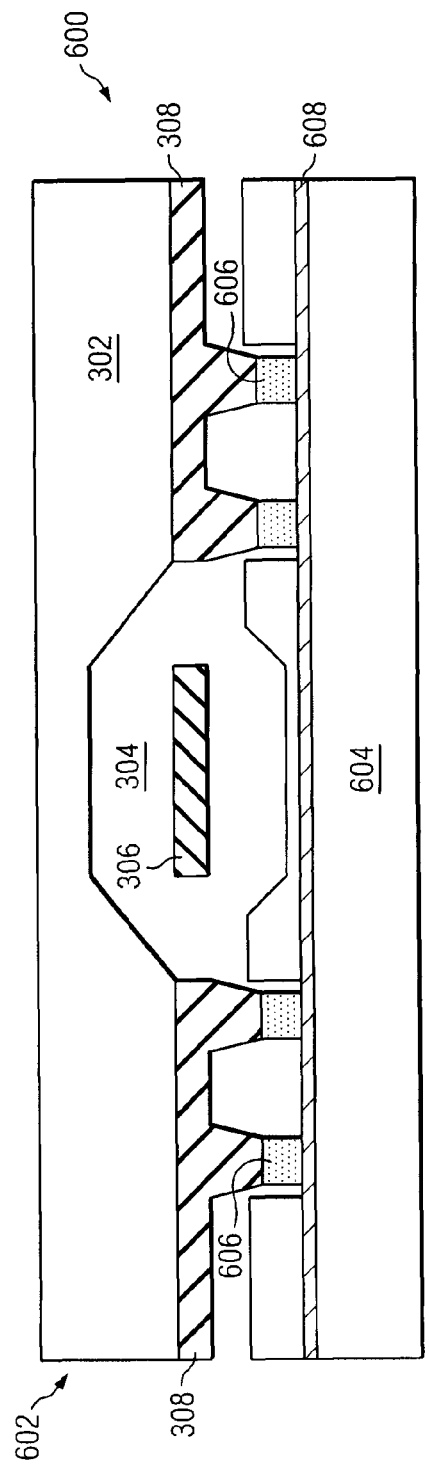
FIG. 6 is a cross-sectional view of an embodiment of a device including a MEMS substrate bonded to a second MEMS substrate.

Referring now to FIG. 6 illustrated is a device 600 which includes a MEMS substrate 602 and a MEMS substrate 604. The device 600 may be fabricated using the method 100, described above with reference to FIG. 1. The MEMS substrate 602 is bonded to the MEMS substrate 604. The MEMS substrate 602 may be substantially similar to the MEMS substrate 300, described above with reference to FIG. 3. The MEMS substrate 602 includes a substrate 302, a MEMS cavity 304, a proof mass 306, and a stand-off feature 308, also described above with reference to FIG. 3. The MEMS substrate 602 also includes a bonding layer 606. The bonding layer 606 may be a substantially silicon based layer such as, an amorphous silicon layer or a polysilicon layer. The bonding layer 606 may be doped with impurities. The bonding layer 606 may be substantially similar to one or more of the bonding layers described above with reference to FIGS. 1, 2, 3, 4, and/or 5. The MEMS substrate 604 includes one or more MEMS devices or functionality. The MEMS substrate 604 also includes a bonding layer 608. The bonding layer 608 may be a substantially aluminum-based layer. The bonding layer 608 maybe substantially similar to the bonding layers described above with reference to FIGS. 1, 2, 3, 4, and/or 5. For example, in an embodiment, the bonding layer 608 is substantially similar to the bonding layer 406 described above with reference to FIG. 4. The bonding layer 608 may form a portion of a MEMS device or provide MEMS functionality. In other embodiments, the bonding layer 608 is a distinct layer.

Figure 7:
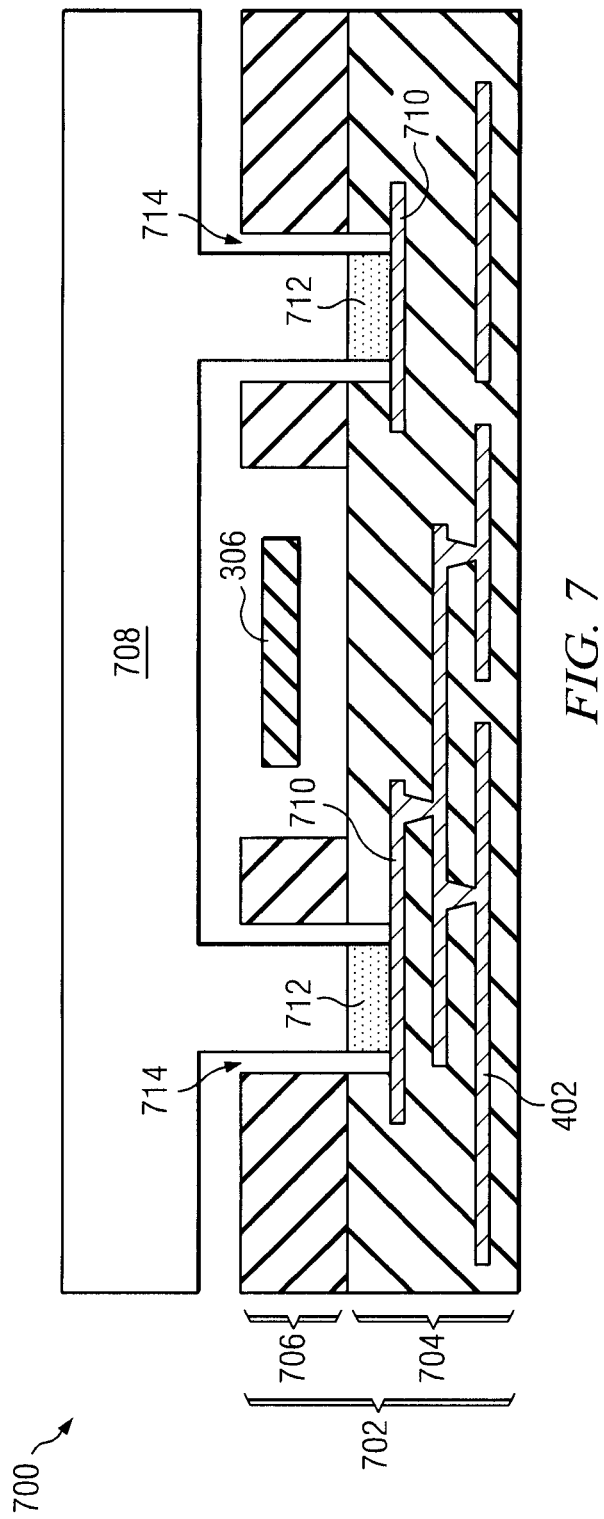
FIG. 7 is a cross-sectional view of an embodiment of a device including a device substrate bonded to a capping substrate.

Referring now to FIG. 7, illustrated is a device 700 which includes a device substrate 702 and a capping substrate 708. The device substrate 702 includes at least one MEMS device and at least one CMOS device formed thereon. The device substrate 702 includes a CMOS layer 704 and a MEMS layer 706. A CMOS device may be formed in the CMOS layer 704. A MEMS device may be formed in the MEMS layer 706 including the proof-mass 306. The device 700 may be fabricated using the method 100, described above with reference to FIG. 1. The capping substrate 708 is bonded to the device substrate 702. Portions of the substrate 702 may be substantially similar to the MEMS substrate 300, described above with reference to FIG. 3 and/or the CMOS substrate 400, described above with reference to FIG. 4. The substrate 702 includes a bonding layer 710. The bonding layer 710 maybe substantially similar to the bonding layers described above with reference to FIGS. 1, 2, 3, 4, and/or 5. In an embodiment, the bonding layer 710 is a substantially aluminum based layer. The bonding layer 710 may be included in a MLI 402. The capping substrate 708 includes a bonding layer 712. The bonding layer 712 may be substantially similar to the bonding layers described above with reference to FIGS. 1, 2, 3, 4, and/or 5. In an embodiment, the bonding layer 712 is amorphous silicon. The device 700 may be formed by providing openings 714 (e.g., bond ring or frame) in the substrate 702 where the capping substrate 708 is socketed into. The device 700 may be illustrative of WLP.

One or more of the described embodiments may provide advantages over the prior art. The bonding of a substantially aluminum layer and a substantially silicon layer may allow the creation of a robust electrical and mechanical interface between two substrates. Such a bond also may allow for hermetic sealing and an electrically conductive path that is capable of being patterned (e.g., localized). Furthermore, such a bond allows for the use CMOS compatible materials (e.g., aluminum which is standard within a CMOS process). Therefore, in an embodiment, wafer-level bonding can be achieved without the addition of any process layers to a CMOS substrate.

Although the embodiments illustrated herein may describe and/or illustrate a single bonding layer deposited on a substrate, this is not required and any plurality of layers may be patterned to form one or more bonding regions between substrates.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method, comprising:
   forming a first semiconductor device on a first substrate;
   forming a first layer on the first substrate, wherein the first layer is amorphous silicon;
   forming a second semiconductor device on a second substrate;
   forming a second layer on the second substrate, wherein the second layer is aluminum; and
   bonding the first layer and the second layer to create an interface between amorphous silicon and aluminum, wherein the interface provides an electrical connection between the first substrate and the second substrate.

2. The method of claim 1, wherein the forming the first layer includes doping the first layer.

3. The method of claim 1, wherein the forming the first layer includes a depositing amorphous silicon by a deposition process selected from the group consisting of physical vapor deposition (PVD), chemical vapor deposition (CVD), evaporation, electron beam evaporation (E-Gun), ion beam, energy beam, and combinations thereof.

4. The method of claim 1, wherein at least one of the forming the first semiconductor device and the forming the second semiconductor device includes forming a MEMS device.

5. The method of claim 1, wherein at least one of the forming the first semiconductor device and the forming the second semiconductor device includes using a complementary metal-oxide semiconductor (CMOS) process.

6. The method of claim 1, further comprising:
   performing at least one of a wet etch and a dry etch on the first layer and the second layer prior to the bonding.

7. A method of fabricating a semiconductor device, comprising:
   forming a micro-electro-mechanical systems (MEMS) device, disposed on a first substrate;
   forming an integrated circuit disposed on a second substrate; and
   bonding the first substrate and the second substrate, wherein the bond includes a first interface between a first bonding layer of amorphous silicon and a second bonding layer including aluminum, wherein the MEMS device and the integrated circuit are electrically connected by the first interface, and wherein the bonding the first interface provides an edge of a hermetically sealed cavity.

8. The method of claim 7, wherein the bonding includes a second interface between the first bonding layer and the second bonding layer, wherein no electrical connection is provided by the second interface, and wherein the second interface provides a second edge of the hermetically sealed cavity.

9. The method of claim 7, further comprising:
   forming a second MEMS device on the second substrate.

10. The method of claim 7, wherein the bonding is performed at a temperature of approximately 50 Celsius.

11. A method, comprising:
    providing a first substrate including a first bonding layer, wherein the first bonding layer is amorphous silicon;
    providing a second substrate including a second bonding layer, wherein the second bonding layer is aluminum, and wherein the second bonding layer is one layer of a multi-layer interconnect (MLI) of an integrated circuit; and bonding the first substrate and the second substrate, wherein the bonding includes forming a bond region having an interface between the amorphous silicon of the first bonding layer and the aluminum of the second bonding layer.

12. The method of claim 11, further comprising:

forming a micro-electro-mechanical systems (MEMS) device on at least one of the first substrate and the second substrate.

13. The method of claim 11, wherein the bond between the first bonding layer and the second bonding layer provides an electrical connection between the first substrate and the second substrate.

* * * * *